US 6,677,248 B2

(12) United States Patent
Kwon et al.

(10) Patent No.: US 6,677,248 B2
(45) Date of Patent: Jan. 13, 2004

(54) COAXIAL TYPE SIGNAL LINE AND MANUFACTURING METHOD THEREOF

(75) Inventors: Young-Se Kwon, Daejeon (KR); In-Ho Jeong, Daejeon (KR)

(73) Assignee: Dynamic Solutions International, Inc., Seoul (KR)

( * ) Notice: Subject to any disclaimer, the term of this patent is extended or adjusted under 35 U.S.C. 154(b) by 246 days.

(21) Appl. No.: 10/045,427

(22) Filed: Nov. 8, 2001

(65) Prior Publication Data

US 2002/0075104 A1 Jun. 20, 2002

Related U.S. Application Data

(62) Division of application No. 09/472,584, filed on Dec. 27, 1999, now Pat. No. 6,466,112.

(30) Foreign Application Priority Data

Dec. 28, 1998 (KR) .............................................. 98-59189
Dec. 21, 1999 (KR) .............................................. 99-59866

(51) Int. Cl.$^7$ ................................................ H01L 21/00
(52) U.S. Cl. ......................... 438/723; 216/13; 216/38; 438/743
(58) Field of Search .................................. 438/692, 719, 438/723, 743; 216/13, 38, 67, 41; 333/243

(56) References Cited

U.S. PATENT DOCUMENTS 5,652,557 A * 7/1997 Ishikawa ..................... 333/243

* cited by examiner

Primary Examiner—William A. Powell
(74) Attorney, Agent, or Firm—Fish & Richardson P.C.

(57) ABSTRACT

Disclosed is a coaxial type signal line that solves problems associated with signal interference and the connection of signal lines that are generated in a radio frequency (RF) electrical system. A method for manufacturing the coaxial type signal line includes the steps of forming a groove on a substrate, forming a first ground line on a surface of the groove and a plain surface of the substrate, forming a first dielectric layer including dielectric material on the first ground line formed on the surface of the groove, forming a signal line on the first dielectric layer the signal line for transmitting signals, forming a second dielectric layer including dielectric material on the signal line and the first dielectric layer, and forming a second ground line on the first ground line and the second dielectric layer. Since the signal line in the signal line structure according to the present invention is electrically shielded by the first and second ground lines, interference between the signal line and other signal lines on the semiconductor substrate can be prevented, and accordingly, the signal lines may be designed compactly on a semiconductor substrate and the system size can be reduced.

17 Claims, 13 Drawing Sheets

COAXIAL TYPE SIGNAL LINE AND MANUFACTURING METHOD THEREOF

CROSS REFERENCE TO RELATED APPLICATION

Pursuant to 35 U.S.C. §121, this application is a divisional application of and claims priority from U.S. application Ser. No. 09/472,584, filed Dec. 27, 1999, now U.S. Pat. No. 6,466,112.

BACKGROUND OF THE INVENTION (a) Field of the Invention

The present invention relates to a coaxial type signal line and the fabricating method thereof. More specifically, the present invention relates to a coaxial type signal line and its fabricating method in order to accomplish the removal of signal interference generated in a radio frequency (RF) electrical system and to reduce the overall dimensions of the whole system.

(b) Description of the Related Art

A conventional RF signal system utilizes coplanar and micro strip type transmission lines.

The coplanar type transmission line is flat and easy to manufacture. The characteristic impedance of a coplanar type transmission line is determined by the area of the signal line and a gap from the ground. This characteristic impedance depends on the type and quality of the substrate. This coplanar type is the transmission line generally used when a system or circuit is implemented on a semiconductor.

The characteristic impedance of the micro strip type transmission line is determined by a height between the grounding of the lower ground and the signal line and the area of the signal line. This type of transmission line is generally used in an implementation of a system using a printed circuit board (PCB). Recently, it has also been used in semiconductors systems.

Both types of these two signal lines are not shielded, that is, are open, and during signal transmission, radiative losses occur. Additionally, the open areas of these signal lines generate interference for other signal lines. To solve this problem, metal is either deposited to shield the upper part of these two types of signal lines or a lower substrate is etched. However, these efforts are only partially effective as well as being difficult to implement, and the fundamental losses caused by signal interference and radiation are not prevented.

Recently, since the frequencies used in systems are becoming higher, and RF transmitting and receiving systems must be implemented in very small sized PCB, signal interference is becoming a significant factor influencing system performance.

Therefore, in order to improve signal interference and loss features of an open type signal line, there was a need to develop a closed type signal line.

FIG. 1 is a closed signal line structure disclosed in the Japanese patent publication No. 91-211870.

As shown by the conventional closed signal line structure of FIG. 1, a first ground conductor 2 is formed on a semiconductor substrate 1, and a first dielectric layer 3 is formed on the first ground conductor 2. A signal line 4 is formed around the center of the first dielectric layer 3, and a second dielectric layer 5 is formed on the first dielectric layer 3 and the signal line 4. A second ground conductor 6 surrounds the first dielectric layer 3 and the second dielectric layer 5, and is connected to the first ground conductor 2.

According to this structure, since the signal line 4 is electrically shielded by the first and second ground conductors 2 and 6, interference with adjacent signal lines can be reduced.

However, according to the conventional signal line structure as shown in FIG. 1, since the signal line 4 is not positioned on the surface of the semiconductor substrate, but is positioned at a predetermined distance away from the surface of the semiconductor substrate, it is not easy for the signal line 4 to be connected with other signal lines on the semiconductor substrate. Further, although the signal line 4 is connected to the other signal line on the surface of the semiconductor substrate, the signal lines are easily disconnected. Hence, the conventional signal line structure can only be used in the packaging of the signal lines, and the structure cannot be directly applied to the manufacture of integrated circuits (ICs).

Additionally, since the signal line 4 in the conventional signal line structure is formed on a dielectric material, as the frequency transmitted via the signal line 4 becomes higher, the losses increase.

SUMMARY OF THE INVENTION

It is an object of the present invention to provide a coaxial type signal line and its manufacturing method to solve the problems of signal interference and the connection of signal lines associated with a RF electrical system.

In one aspect of the present invention, a coaxial type signal line comprises a substrate including a groove; a first ground line formed on a surface of the groove and on a plain surface of the substrate; a first dielectric layer formed on the first ground line formed on the surface of the groove; a signal line, formed on the first dielectric layer, that transmits signals; a second dielectric layer, formed on the signal line and the first dielectric layer, that surrounds the signal line; and a second ground line, formed on the second dielectric layer and the first ground line that electrically shields the signal line.

In another aspect of the present invention, a coaxial type signal line comprises a substrate including a groove; a first ground line formed on a surface of the groove and on a plain surface of the substrate; a supporter formed on the first ground line formed on the surface of the groove; a signal line, formed on the supporter, that transmits signals; and a second ground line connected to the first ground line formed on the plain surface of the substrate, that encloses a space that surrounds the signal line.

In a still another aspect of the present invention, a method for manufacturing a coaxial type signal line comprises the steps of (a) forming a groove on a substrate; (b) forming a first ground line on a surface of the groove and a plain surface of the substrate; (c) forming a first dielectric layer, including dielectric material, on the first ground line formed on the surface of the groove; (d) forming a signal line on the first dielectric layer, the signal line for transmitting signals; (e) forming a second dielectric layer, including dielectric material, on the signal line and the first dielectric layer; and (f) forming a second ground line on the first ground line and the second dielectric layer.

In a still further aspect of the present invention, a method for manufacturing a coaxial type signal line comprises the steps of (a) forming a groove on a substrate; (b) forming a first ground line on a surface of the groove and a plain surface of the substrate, (c) forming a supporter on the first ground line formed on the surface of the groove; (d) forming a first photoresist on the first ground line and the supporter formed on the surface of the groove, and removing the first photoresist on the supporter so as to expose the supporter; (e) forming a signal line on the exposed supporter, the signal line for transmitting signals; (f) forming a second photoresist on the signal line and the first photoresist; (g) forming a second ground line on the first ground line and the second photoresist; and (h) removing the first and second photoresist within the first and second ground lines.

The above step (d) comprises the steps of forming a first photoresist on the first ground line and the supporter formed on the surface of the groove and the plain surface of the substrate; and removing the first photoresist on the supporter so as to expose the supporter.

The above step (e) comprises the steps of forming sacrificial metal for coating on the first photoresist and the exposed supporter; coating a third photoresist on the sacrificial metal, and removing the third photoresist on the supporter so as to expose the sacrificial metal formed on the supporter, and forming a signal line for signal transmission on the exposed sacrificial metal by a coating process.

The above step (g) comprises the steps of removing the third photoresist and the sacrificial metal; smoothing the first photoresist and exposing the first ground line on the plain surface of the substrate; and forming the second photoresist on the signal line and the first photoresist.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION OF THE PREFERRED EMBODIMENTS

In the following detailed description, only the preferred embodiments of the invention have been shown and described, simply by way of illustration of the best modes contemplated by the inventor(s) of carrying out the invention. As will be realized, the invention is capable of modification in various obvious respects, all without departing from the invention. Accordingly, the drawings and description are to be regarded as illustrative in nature, and not restrictive.

A coaxial type signal line and its manufacturing method according to a first preferred embodiment of the present invention will now be described referring to FIG. 2 through FIG. 7.

Figure 7:
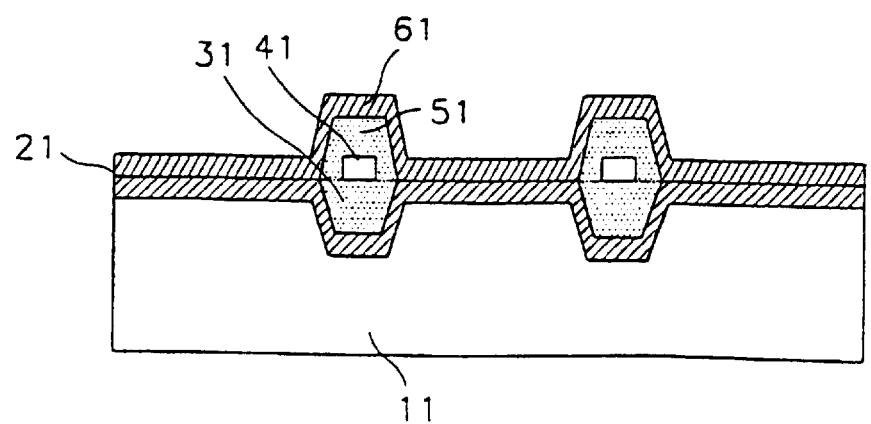

FIG. 7 is a cross sectional view of a signal line structure according to a first preferred embodiment of the present invention.

As shown, the signal line structure according to the first preferred embodiment of the present invention comprises a semiconductor substrate 11, first and second ground lines 21 and 61, first and second dielectric layers 31 and 51, and a signal line 41.

The semiconductor substrate 11 includes a groove, and the first ground line 21 is formed on the surface of the semiconductor substrate 11 and on the surface of the groove. The first dielectric layer 31 is formed on the first ground line formed on the groove of the semiconductor substrate 11. The signal line 41 that transmits signals is formed near the center of the first dielectric layer 31. Here, the signal line 41 is positioned so that it has almost the same height as the first ground line 21 formed on the surface of the semiconductor substrate 11. The second dielectric layer 51 is formed on the signal line 41 and the first dielectric layer 31 so as to cover the signal line 41, and the second ground line 61 is formed on the second dielectric layer 51 and the first ground line 21. The first and second ground lines 21 and 61 electrically shield the signal line 41.

A manufacturing method for a signal line according to a preferred embodiment of the present invention will now be described referring to FIG. 2 through FIG. 7.

Figure 1:
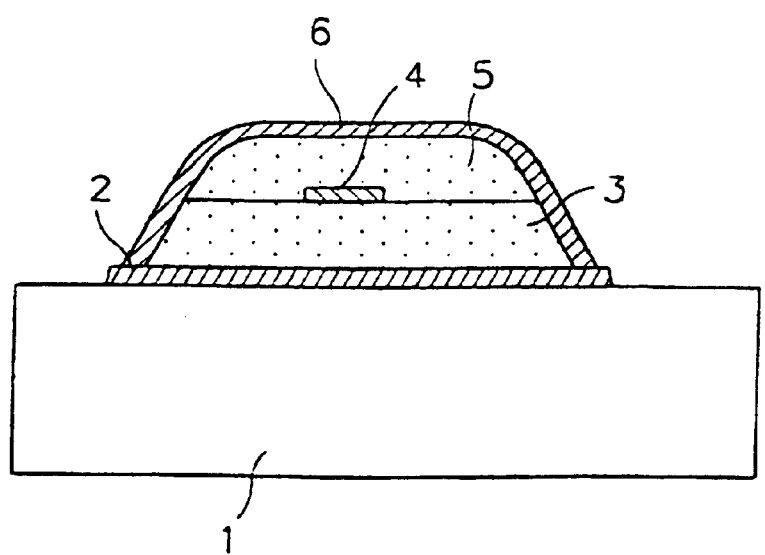
FIG. 1 is a cross sectional view of a conventional signal line.
Figure 2:
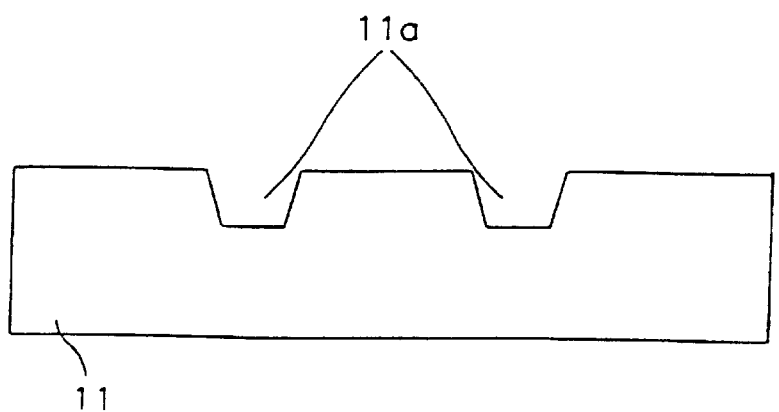
FIG. 2 to FIG. 7 illustrate a method for manufacturing a signal line according to a first preferred embodiment of the present invention.
Figure 3:
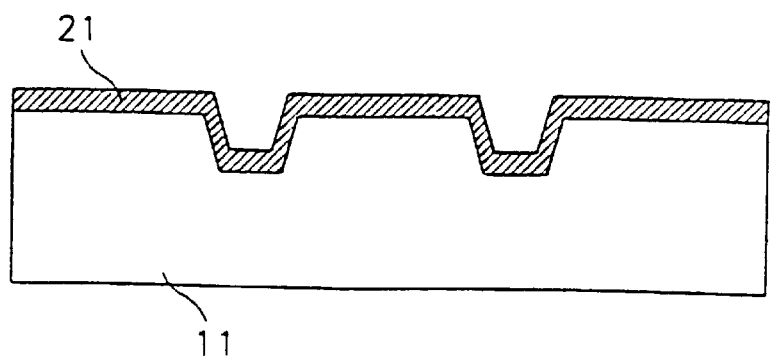

As shown in FIG. 2, the grooves 11a are etched at places at which the signal lines of the semiconductor substrate 11 are formed in a predetermined form. Additionally, as shown in FIG. 3, material is deposited or coated on the semiconductor substrate 11 so as to form the first ground line 21.

Figure 4:
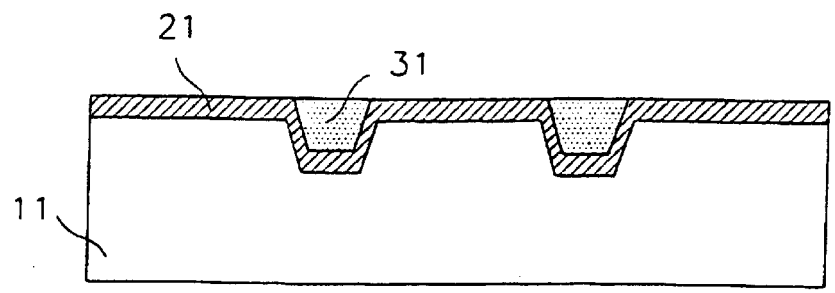
Figure 5:
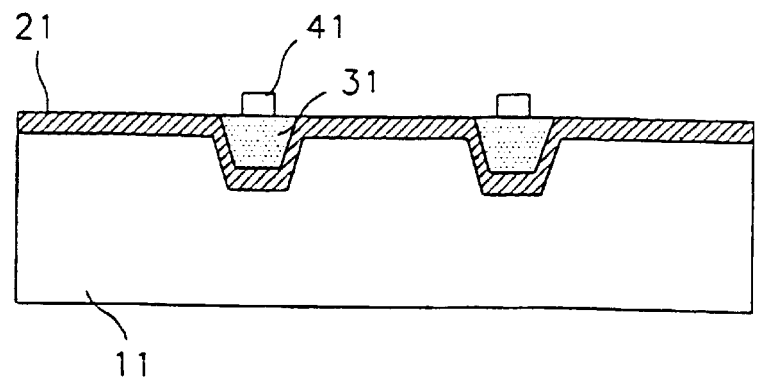

As shown in FIG. 4, the first dielectric layer 31 is coated on the first ground line 21 formed in the grooves 11a of the semiconductor substrate 11, and then this layer is smoothed. FIG. 5 shows that the metallic signal line 41 is formed near the center of the smoothed surface of the first dielectric layer 31.

Figure 6:
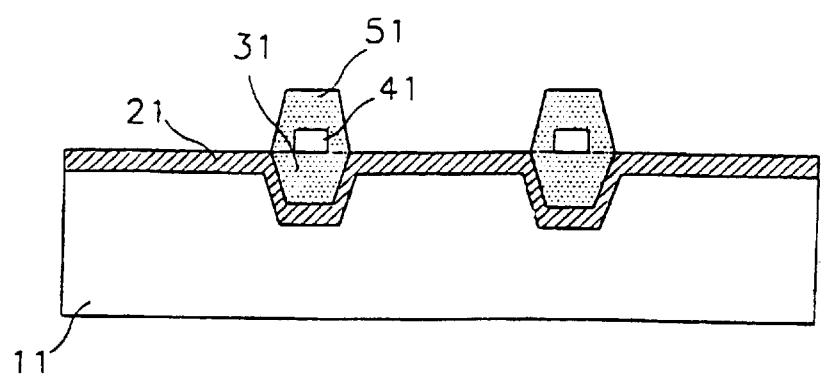

As shown in FIG. 6, the second dielectric layer 51 is formed on the signal line 41 and the first dielectric layer 31. At this time, the second dielectric layer 51 is preferably formed such that the signal line 41 has both right/left and upper/lower symmetry with respect to the first and second dielectric layers 31 and 51. For this, the second dielectric layer 51 is formed by an chemical vapor deposition (CVD) or a spin coating method, and a predetermined part of the second dielectric layer 51 is etched by using plasma gas in order for the signal line 41 to achieve both right/left and upper/lower symmetry with respect to the first and second dielectric layers 31 and 51.

Lastly, a second ground line 61 is formed by depositing or coating metal. At this time, since the first ground line 21 is exposed, the first and second ground lines 21 and 61 are naturally connected to each other.

The characteristic impedance and transmission characteristics of the signal line structure according to the first preferred embodiment of the present invention is dependent on the thickness and width of the signal line and the shape of the dielectric layer surrounded by the first and second ground lines (i.e., the etched form of the semiconductor substrate and dielectric layer).

Since the signal line 31 according to the first preferred embodiment of the present invention is electrically shielded by the two ground lines 21 and 61, the interference between this signal line and the other signal lines on the semiconductor substrate can be prevented. Therefore, the signal lines on the semiconductor substrate can be compactly designed, and the system can thus become smaller.

Further, since the signal line is formed at a height similar to the surface of the semiconductor substrate, the signal line can easily be connected to other signal lines formed on the semiconductor substrate. Hence, the signal line structure according to the first preferred embodiment of the present invention can be utilized not only in the packaging structure of multiple signal lines, but also in the actual driving of integrated circuits.

However, since the signal line 41 is surrounded by the first and second dielectric layers 31 and 51, as the frequency transmitted by the signal line 41 becomes higher, the losses caused by the dielectric material increase.

Another signal line structure according to a second preferred embodiment of the present invention solves this problem.

A coaxial type signal line and its manufacturing method according to a second preferred embodiment of the present invention will now be described referring to FIG. 8 through FIG. 15.

Figure 15:
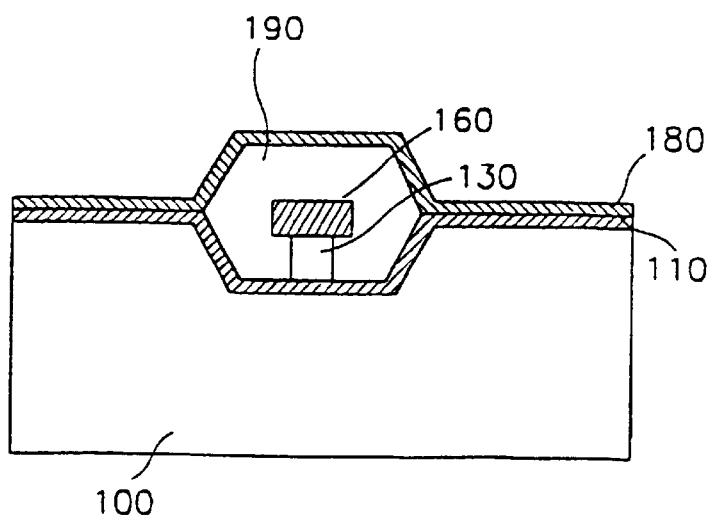

FIG. 15 is a cross sectional view of the signal line structure according to the second preferred embodiment of the present invention.

As shown, the signal line structure according to the second preferred embodiment of the present invention comprises a semiconductor substrate 100, first and second ground lines 110 and 180, a supporter 130, and a signal line 160.

The semiconductor substrate 100 has a predetermined groove, and the first ground line 110 is formed on the surface of the semiconductor substrate 100 and on the surface of the groove. The supporter 130 is made of dielectric material, and is formed near the center on the first ground line 110 formed on the semiconductor substrate 100. The signal line 160 is formed on the supporter 130. At this time, the signal line 160 is positioned so that it has almost an identical height with that of the first ground line 110 formed on the surface of the semiconductor substrate 100. The second ground line 180 surrounds the signal line 160, and encloses an empty space 190 surrounding the signal line 160, and is connected to the ground line 110. Here, the space 190 can either be vacuous or can contain air. The first and second ground lines 110 and 180 electrically shield the signal line 160.

A method for manufacturing a signal line structure according to a second preferred embodiment of the present invention will now be described referring to FIG. 8 through FIG. 15.

Figure 8:
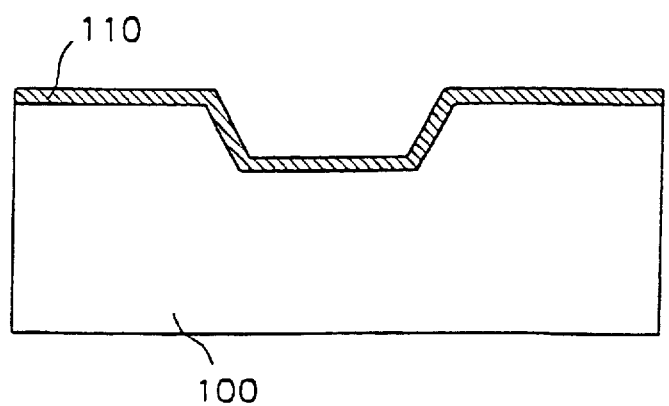
FIG. 8 to FIG. 15 illustrate a method for manufacturing a signal line according to a second preferred embodiment of the present invention.

As shown in FIG. 8, a groove is etched in a predetermined shape at a place in which a signal line will be formed on the semiconductor substrate 100, and metal is deposited or coated on the surfaces of the groove and the semiconductor substrate so as to form the first ground line 110.

Figure 9:
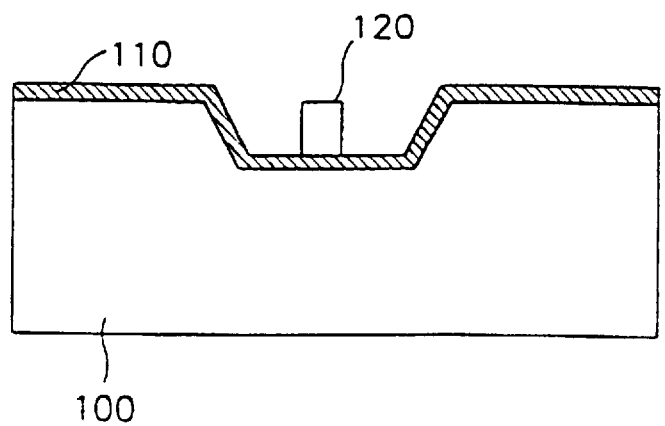

As shown in FIG. 9, a supporter 120 is formed near the center of the first ground line 110 formed in the groove. Or to express this more concretely, according to the second preferred embodiment of the present invention, photosensitive dielectric material is coated on the first ground line, and the supporter 120 is then formed using photolithography.

Figure 10:
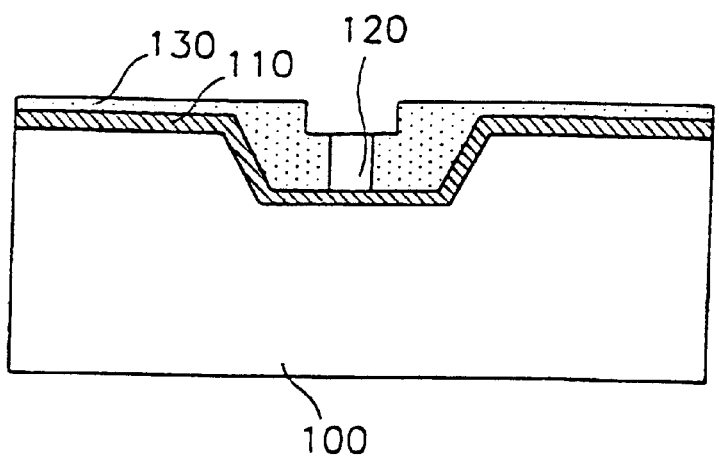

As shown in FIG. 10, photoresist 130 is coated on the first ground line 110 and the supporter 120, and the photoresist part coated on the supporter 120 is then removed so as to expose the supporter 120.

Figure 11:
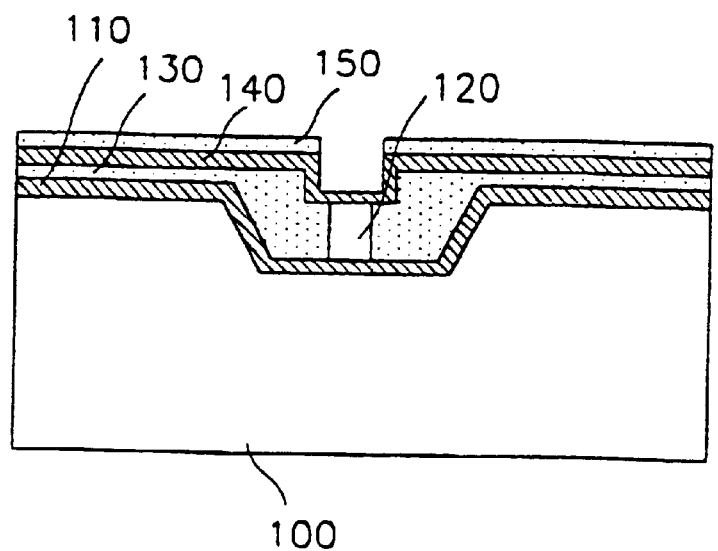

As shown in FIG. 11, a sacrificial metal layer 140 is formed on the photoresist 130 and the exposed supporter 120, and a photoresist 150 is coated on the sacrificial metal 140, and the photoresist on the supporter 120 is removed to expose the sacrificial metal.

Figure 12:
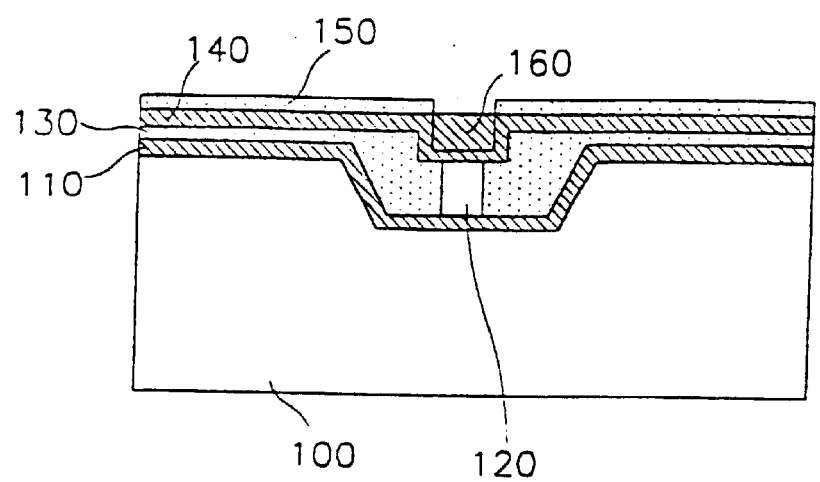

As shown in FIG. 12, a signal line 160 for transmission of the signals is then formed on the exposed sacrificial metal by a coating process.

Figure 13:
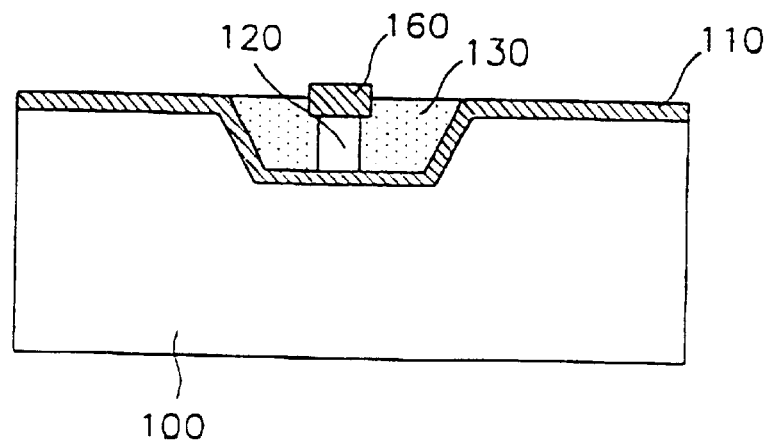

As shown in FIG. 13, the photoresist 150 and the sacrificial metal 140 are then removed, and the photoresist 130 is smoothed to expose the first ground line 110.

Figure 14:
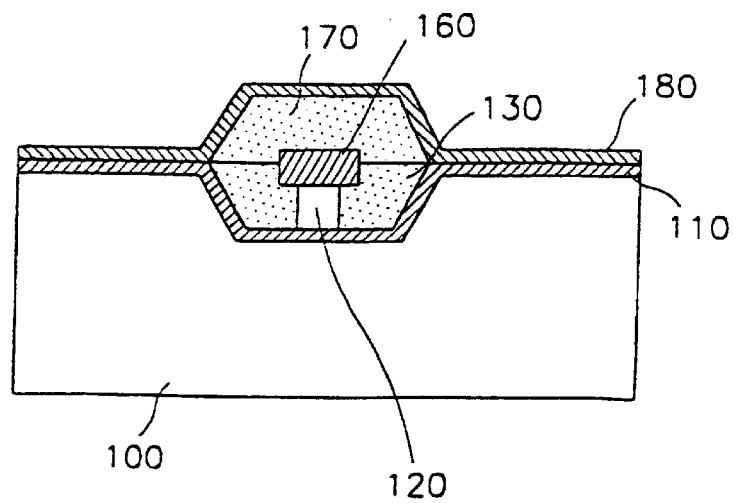

As shown in FIG. 14, a photoresist 170 is formed on the signal line 160 and the photoresist 130. At this time the photoresist 170 is preferably formed so that the signal line 160 may have both right/left and upper/lower symmetry with the photoresists 130 and 170. A second ground line 180 is formed by a metal deposition or coating process. At this time, since the first ground line 110 has already been exposed, the first and second ground lines 110 and 180 are naturally connected.

Lastly, the photoresists 130 and 170 within the first and second ground lines 110 and 180 are removed through open portions (referring to the space in FIG. 15, these portions are in the normal direction facing the front end and rear ends of the signal line), and therefore, the space 190 surrounded by the first and second ground lines 110 and 180 can become either vacuous or air filled.

Since the signal line 160 is electrically shielded by the two ground lines 110 and 180 in the signal line structure according to the second preferred embodiment of the present invention, the interference between the signal line and other signal lines on the semiconductor substrate can be prevented, and since the signal line is formed at almost an identical height as that of the surface of the semiconductor substrate, the signal line can easily be connected to other signal lines formed on the semiconductor substrate.

Since the space 190 that is surrounded by the first and second ground lines 110 and 180 can be either vacuous or filled with air and is not filled with dielectric material, signal losses caused by an increase of the frequency transmitted by the signal line 160 can be reduced.

The photoresists 130 and 170 filled in between the first and second ground lines 110 and 180 must be removed through the front and rear ends of the signal line. However, if the signal line is too long, this inner photoresist cannot be easily removed.

Figure 16:
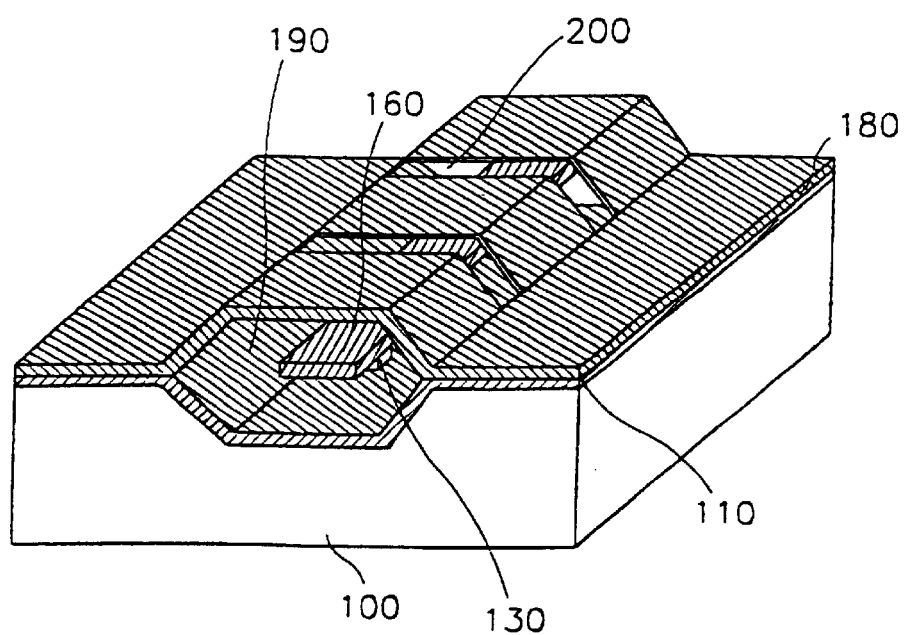
FIG. 16 is a signal line according to a third preferred embodiment of the present invention.

This problem can be solved by a signal line structure according to a third preferred embodiment of the present invention as shown in FIG. 16.

The signal line structure according to the third preferred embodiment of the present invention has the same signal line structure with the signal line structure according to the second preferred embodiment of the present invention, with a difference in that some parts 200 of the second ground line 180 formed on the signal line 160 are left open. At this time, the magnitude of the open parts is preferably below 1/100 of wavelength transmitted through the signal line. Since the inner photoresist is removed through not only the open end parts of the signal lines, but also through the open part 200 of the second ground line, the inner photoresist can effectively be removed. At this time, the signal line structure according to the third preferred embodiment of the present invention has open parts 200, however, since the magnitude of the open parts is much smaller than the wavelength of the transmission signal (for example, the magnitude of the open parts is below 1/100 of the wavelength), electrical shield effect can be maintained with few losses.

A coaxial type signal line and its manufacturing method according to a fourth preferred embodiment of the present invention will now be described referring to FIG. 17 through FIG. 23.

Figure 23:
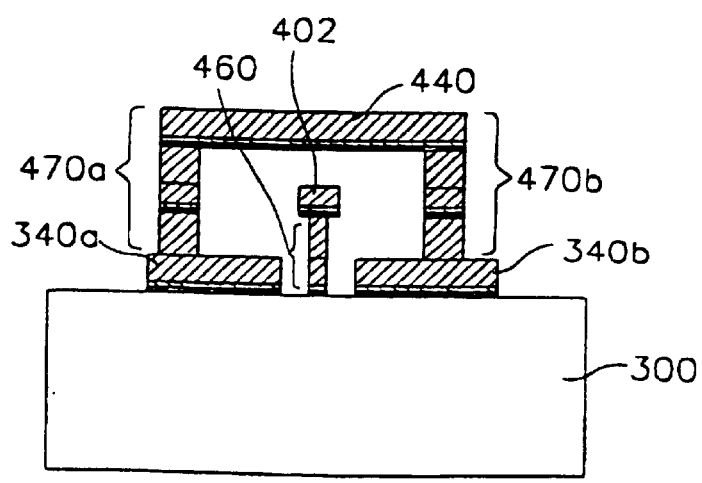

FIG. 23 shows a cross sectional view of the signal line according to the fourth preferred embodiment of the present invention.

As shown, the signal line structure comprises an insulating substrate 300, ground lines 340a, 340b and 440, ground walls 470a and 470b, supporters 460, and a signal line 402.

The metallic ground lines 340a and 340b are formed on the insulating substrate 300. At this time, the ground lines 340a and 340b are disconnected and divided into two parts. The metallic supporters 460 are formed on the surface of the insulating substrate 300 between the divided two ground lines 340a and 340b. On the supporters 460 are formed the signal line 402 for transmission of the signals. At this time, the supporters 460 are preferably repeatedly formed under the signal line 402 with predetermined constant intervals to maintain the signal line.

The ground walls 470a and 470b are nearly vertically formed on the divided ground lines 340a and 340b. The ground line 440 is formed on the ground walls 470a and 470b and electrically connects the ground walls 470a and 470b.

The ground lines 340a, 340b and 440 and the ground walls 470a and 470b surround the signal line with a predetermined space so as to electrically shield the signal line 402. At this time, the space can be vacuous or contains air.

A method for manufacturing a signal line structure according to the fourth preferred embodiment of the present invention will now be described referring to FIG. 17–FIG. 23.

Figure 17:
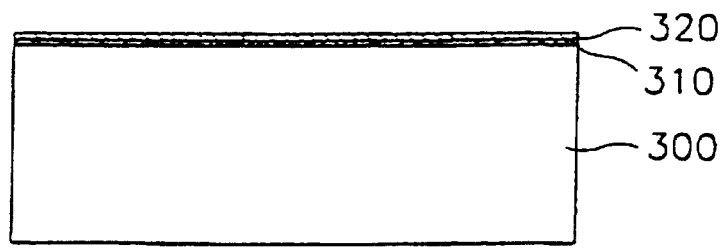
FIG. 17 to FIG. 23 illustrate a method for manufacturing a signal line according to a fourth preferred embodiment of the present invention.

As shown in FIG. 17, a sacrificial metal layer 310 and a metallic layer 320 are sequentially deposited on the insulating substrate 300. In the fourth preferred embodiment of the present invention, titanium Ti is used as the sacrificial metal layer 310, and the gold is used as the metallic layer 320. Here, the surface of the titanium is quickly oxidized.

Figure 18:
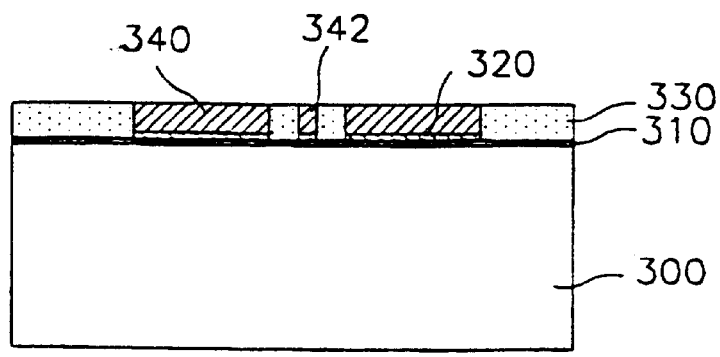

As shown in FIG. 18, some part of the metallic layer 320 on which the lower ground and the supporters will be formed remains, and the other part of the metallic layer 320 is removed, and the photoresist 330 is formed on an area on which the metallic layer 320 is removed. First coating layers 340 and 342 are formed on the areas on which the photoresist is not formed by performing an electric coating process. At this time, the coating layer 340 is used as a ground line, and the coating layer 342 is used as a supporter for the signal line. The copper is used as the coating layers 340 and 342 in the fourth preferred embodiment of the present invention.

Figure 19:
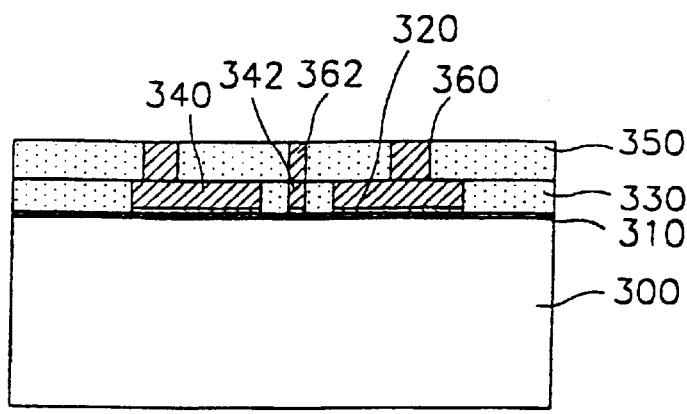

As shown in FIG. 19, after the photoresist 350 is formed on the photoresist 330 and the first coating layers 340 and 342, some photoresist on an area where the ground walls and the supporters will be formed is removed so as to expose some area of the first coating layers 340 and 342. Second coating layers 360 and 362 are formed on the exposed first coating layers 340 and 342 by a coating process. The second coating layer 360 is used as a ground wall, and the other second coating layer 362 is used as a supporter for the signal line. At this time, in the fourth preferred embodiment of the present invention, since the second coating layers 360 and 362 are respectively formed on the first coating layers 340 and 342, additional sacrificial metal layer is not necessary to be formed for a coating process.

Figure 20:
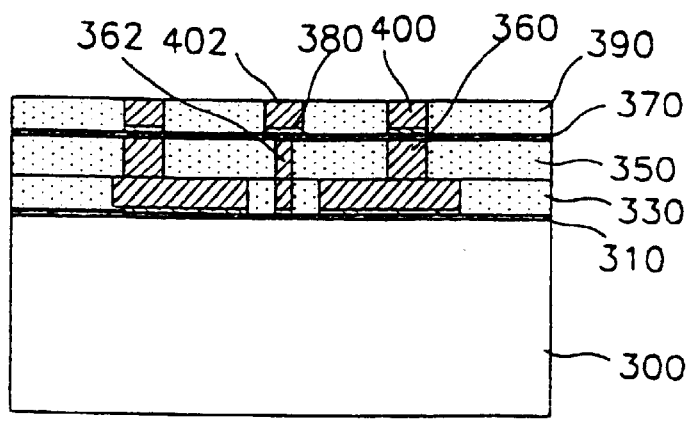

As shown in FIG. 20, a sacrificial metal layer 370 and a metallic layer 380 are sequentially deposited on the photoresist 350 and the second coating layers 360 and 362. Some part of the metallic layer 380 on which the ground wall and the supporters will be formed remains, and the other part of the metallic layer 380 is removed, and a photoresist 390 is formed on an area on which the metallic layer 380 is removed. Third coating layers 400 and 402 are formed on the areas on which the photoresist is not formed by performing an electric coating process. At this time, the coating layer 400 is used as a ground wall, and the other coating layer 402 is used as a signal line for the transmission of the signal line.

Figure 21:
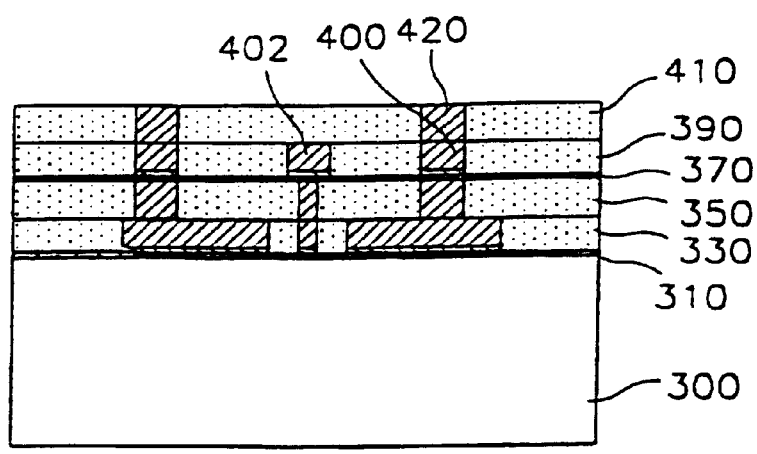

As shown in FIG. 21, a photoresist 410 is formed on the photoresist 390 and the third coating layers 400 and 402, and the photoresist on which a ground wall will be formed is removed so as to expose some part of the third coating layer 400. After this, a fourth coating layer 420 is formed on the exposed third coating layer 400 by a coating process.

Figure 22:
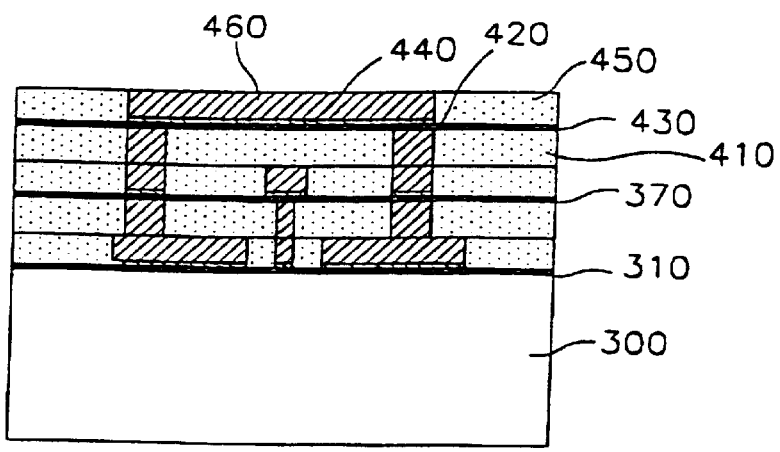

As shown in FIG. 22, a sacrificial metal layer 430 and a metallic layer 440 are sequentially deposited on the photoresist 410 and the fourth coating layers 420. Some part of the metallic layer 440 on which an upper ground line will be formed remains, and the other part of the metallic layer 440 is removed, and a photoresist 450 is formed on an area on which the metallic layer 440 is removed. A fifth coating layer 460 is formed on areas on which the photoresist is not formed by performing an electric coating process. At this time, some part of the fifth coating layer 460 can be exposed in like manner of the third preferred embodiment of the present invention as shown in FIG. 16, and the magnitude of the exposed part is preferably much smaller compared to the wavelength transmitted to the signal line (for example, below 1/100).

Lastly, as shown in FIG. 23, the coaxial signal line according to the fourth preferred embodiment of the present invention is formed by a process of removing the photoresist and the sacrificial metal layer.

As mentioned above, in the fourth preferred embodiment of the present invention, the titanium Ti is used as a sacrificial metal layer. Advantages of using the titanium are as follows. Since a flatness of a lower photoresist becomes worse as a process goes on in the process of using multiple-layered photoresist, another coating process can be performed below the lower photoresist that functions as a mask in the upper coating process. However, according to the fourth preferred embodiment of the present invention, since the surface of the titanium formed on the lower photoresist is quickly oxidized in of the air, it can be prevented that a coating process is performed below the lower photoresist with no relation to the flatness of the lower photoresist, while maintaining the conductibility of a sacrificial metal.

Other modifications can also be possible.

For example, in the second preferred embodiment of the present invention, the signal line is formed via a coating process, however, it can also be formed via a deposition process.

In the first and second preferred embodiments of the present invention, the areas surrounded by the first and second ground lines are illustrated as being hexagonal. However, these areas can also be other symmetrical shapes such as elliptical or circular shapes, or can even be asymmetrical.

In the fourth preferred embodiment of the present invention, the metal material of the metallic layer and the metal material of the coating layer are different, however, identical metal can also be used. In the preferred embodiments of the present invention, only the semiconductor substrate is described, however, it is also possible to use other forms of substrates.

While this invention has been described in connection with what is presently considered to be the most practical and preferred embodiment, it is to be understood that the invention is not limited to the disclosed embodiments, but, on the contrary, is intended to cover various modifications and equivalent arrangements included within the spirit and scope of the appended claims.

What is claimed is:

1. A method for manufacturing a coaxial type signal line, comprising the steps of:
   (a) forming a groove on a substrate;
   (b) forming a first ground line on a surface of the groove and a plain surface of the substrate;
   (c) forming a first dielectric layer, including dielectric material, on the first ground line formed on the surface of the groove;
   (d) forming a signal line on the first dielectric layer, the signal line for transmitting signals;
   (e) forming a second dielectric layer, including dielectric material, on the signal line and the first dielectric layer; and
   (f) forming a second ground line on the first ground line and the second dielectric layer.

2. The method of claim 1, wherein the substrate is a semiconductor substrate, and the groove is formed by an etching process.

3. The method of claim 1, wherein the step (c) comprises steps of:
   coating the first dielectric layer on the first ground line; and
   smoothing the first dielectric layer, and exposing the first ground line on the plain surface of the substrate.

4. The method of claim 1, wherein the signal line is symmetrically surrounded by the first and second ground lines.

5. The method of claim 4, wherein the step (e) comprises the step of:
   forming dielectric material on the signal line and the first dielectric layer by a chemical vapor deposition or a spin coating process; and
   etching the dielectric material by using a plasma gas, thereby forming the second dielectric layer so that the signal line becomes symmetric with the first and second dielectric layers.

6. A method for manufacturing a coaxial type signal line, comprising the steps of:
   (a) forming a groove on a substrate;
   (b) forming a first ground line on a surface of the groove and a plain surface of the substrate;
   (c) forming a supporter on the first ground line formed on the surface of the groove;
   (d) forming a first photoresist on the first ground line and the supporter formed on the surface of the groove, and removing the first photoresist on the supporter so as to expose the supporter;
   (e) forming a signal line on the disclosed supporter, the signal line for transmitting signals;
   (f) forming a second photoresist on the signal line and the first photoresist;
   (g) forming a second ground line on the first ground line and the second photoresist; and
   (h) removing the first and second photoresist within the first and second ground lines.

7. The method of claim 6, wherein the step (d) comprises the steps of:
   forming a first photoresist on the first ground line and the supporter formed on the surface of the groove and the plain surface of the substrate; and
   removing the first photoresist on the supporter so as to expose the supporter.

8. The method of claim 7, wherein the step (e) comprises the steps of:
   forming sacrificial metal for coating on the first photoresist and the disclosed supporter;
   coating a third photoresist on the sacrificial metal, and removing the third photoresist on the supporter so as to expose the sacrificial metal formed on the supporter; and
   forming a signal line for signal transmission on the exposed sacrificial metal by a coating process.

9. The method of claim 8, wherein the step (g) comprises the steps of:
   removing the third photoresist and the sacrificial metal;
   smoothing the first photoresist and disclosing the first ground line on the plain surface of the substrate; and
   forming the second photoresist on the signal line and the first photoresist.

10. The method of claim 7, wherein the signal line is positioned such that it has a similar height as that of the first ground line formed on the plain surface of the substrate.

11. The method of claim 7, wherein the second ground line has an open part in an upper portion, and the first and second photoresists within the first and second ground lines are removed through the open part.

12. A method for manufacturing a coaxial type signal line, comprising the steps of:
   (a) forming a first sacrificial metal layer on a substrate;
   (b) forming a first photoresist on the first sacrificial metal layer, the first photoresist including first, second, and third open parts;
   (c) respectively forming first, second, and third coating layers on the first, second, and third open parts by performing coating processes;
   (d) forming a second photoresist on the first photoresist, the second photoresist including fourth, fifth, and sixth open parts on the respective first, second, and third coating layers;
   (e) respectively forming fourth, fifth, and sixth coating layers on the fourth, fifth, and sixth open parts by performing coating processes;
   (f) forming a third photoresist on the second photoresist, the third photoresist including seventh, eighth, and ninth open parts on the respective fourth, fifth, and sixth coating layers;
   (g) respectively forming seventh, eighth, and ninth coating layers on the seventh, eighth, and ninth open parts by performing coating processes;
   (h) forming a fourth photoresist on the third photoresist and the eighth coating layer, the fourth photoresist including tenth and eleventh open parts on the respective seventh and ninth coating layers;
   (i) respectively forming tenth and eleventh coating layers on the tenth and eleventh open parts by performing coating processes;
   (j) forming a second sacrificial metal layer on the fourth photoresist and the tenth and eleventh coating layers;
   (k) forming a fifth photoresist on the second sacrificial metal layer, the fifth photoresist including a twelfth open part connecting the tenth and eleventh coating layers;
   (l) forming a twelfth coating layer on the twelfth open part by performing coating processes; and (m) removing the first through fifth photoresists and the first and second sacrificial metal layers not adjacent to and the coating layers.

13. The method of claim 12, wherein the eighth coating layer is a signal line for transmission of signals, and the first, fourth, seventh, tenth, twelfth, eleventh, ninth, sixth, and third coating layers are electrically connected and shield the eighth coating layer.

14. The method of claim 13, wherein the twelfth coating layer includes an open part on the upper part, and, the first through fifth photoresists surrounded by the first, fourth, seventh, tenth, twelfth, eleventh, ninth, sixth, and third coating layers are removed through the open part.

15. The method of claim 13, wherein the step (e) further comprises a step of forming a third sacrificial metal layer on the fourth, fifth, and sixth coating layers and the second photoresist, and the step (f) is characterized in that the third photoresist that has the seventh, eighth, and ninth open parts corresponding to the fourth, fifth, and sixth coating layers is formed on the third sacrificial metal layer.

16. The method of claim 15, wherein the method further comprises the step of forming a metallic layer on areas of the first through third sacrificial metal layers corresponding to parts on which the coating layers will be formed, before forming the first through third coating layers, the seventh through ninth coating layers, and the twelfth coating layer on the respective first, third, and second sacrificial metal layers.

17. The method of claim 13, wherein the sacrificial metal layers are made of titanium.

* * * * *